United States Patent
Murray et al.

(10) Patent No.: US 7,492,291 B2
(45) Date of Patent: Feb. 17, 2009

(54) METHODS AND APPARATUS FOR INTERFACING A PLURALITY OF ENCODED SERIAL DATA STREAMS TO A SERIALIZER/DESERIALIZER CIRCUIT

(75) Inventors: Brian Murray, Ranelagh (IE); Jacobo Riesco, Caceres (ES); Gregory W. Sheets, Breinigsville, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/741,789

(22) Filed: Apr. 30, 2007

(65) Prior Publication Data

US 2008/0095218 A1  Apr. 24, 2008

Related U.S. Application Data

(60) Provisional application No. 60/853,153, filed on Oct. 20, 2006.

(51) Int. Cl.
*H03M 9/00* (2006.01)
(52) U.S. Cl. .................... 341/101; 341/100; 341/61; 341/102; 341/103; 375/259; 375/265; 375/354; 714/784; 714/786; 714/752; 714/762; 710/10; 710/14; 710/305
(58) Field of Classification Search ............ 341/61, 341/101, 102, 103, 104; 375/259, 265, 354; 714/784, 786, 752, 762; 710/10, 14, 305
See application file for complete search history.

(56) References Cited

U.S. PATENT DOCUMENTS

| | | | | |
|---|---|---|---|---|
| 6,385,738 B1 * | 5/2002 | Lo | .............................. | 714/25 |
| 6,624,763 B2 * | 9/2003 | Kuo et al. | ..................... | 341/58 |
| 6,768,429 B2 * | 7/2004 | Kuo et al. | ..................... | 341/58 |
| 7,024,653 B1 * | 4/2006 | Moore et al. | ................... | 716/16 |
| 7,076,724 B2 * | 7/2006 | Cole et al. | ................... | 714/784 |
| 7,106,968 B2 * | 9/2006 | Lahav et al. | .................. | 398/47 |

(Continued)

OTHER PUBLICATIONS

"QSGMII Specification," Cisco System, Document No. EDCS-540123, Revision 0.3, pp. 1-16 (Sep. 6, 2006).

*Primary Examiner*—Linh V Nguyen
(74) *Attorney, Agent, or Firm*—Ryan, Mason & Lewis, LLP

(57) ABSTRACT

Methods and apparatus are provided for interfacing a plurality of encoded serial data streams, such as Serial Gigabit Media Independent Interface streams, to a serializer/deserializer circuit. A plurality of encoded serial data streams are transmitted by receiving the plurality of encoded serial data streams that have been encoded using an encoding scheme that provides a substantially uniform distribution of a first code and a second code; marking at least one of the encoded serial data streams (such as changing a first code to a predefined code); and combining at least two of the plurality of encoded serial data streams into a single data stream. A plurality of encoded serial data streams are received by receiving a single data stream comprised of the plurality of encoded serial data streams; detecting a mark in the single data stream; demultiplexing the single data stream into the plurality of encoded serial data streams based on the mark; and providing the demultiplexed plurality of encoded serial data streams to a decoder that decodes the plurality of encoded serial data streams using a decoding scheme that provides a substantially uniform distribution of a first code and a second code.

19 Claims, 5 Drawing Sheets

U.S. PATENT DOCUMENTS

| | | | |
|---|---|---|---|
| 7,187,709 B1 * | 3/2007 | Menon et al. | 375/219 |
| 7,272,679 B2 * | 9/2007 | Taborek et al. | 710/305 |
| 7,296,211 B2 * | 11/2007 | Cole et al. | 714/776 |
| 2001/0024457 A1 * | 9/2001 | Barry et al. | 370/537 |
| 2004/0075594 A1 * | 4/2004 | Kuo et al. | 341/58 |
| 2006/0143355 A1 * | 6/2006 | Taborek et al. | 710/305 |
| 2007/0101241 A1 * | 5/2007 | Hoyer | 714/776 |
| 2007/0157060 A1 * | 7/2007 | Ganga et al. | 714/752 |
| 2007/0234172 A1 * | 10/2007 | Chiabrera | 714/752 |

* cited by examiner

| | INTERLEAVED SGMII PORTS | ENCODING | SYMBOL RATE | DATA RATE |
|---|---|---|---|---|
| XFSGMII-2GI | 2 | 8b/10b | 2.5 GHz | 2 Gb/s |
| XFSGMII-4GI | 4 | 8b/10b | 5.0 GHz | 4 Gb/s |
| XFSGMII-5GI | 5 | 8b/10b | 6.25 GHz | 5 Gb/s |
| XFSGMII-8GI | 8 | 8b/10b | 10.0 GHz | 8 Gb/s |

METHODS AND APPARATUS FOR INTERFACING A PLURALITY OF ENCODED SERIAL DATA STREAMS TO A SERIALIZER/DESERIALIZER CIRCUIT

CROSS-REFERENCE TO RELATED APPLICATIONS

The present application claims priority to U.S. Provisional Patent Application Ser. No. 60/853,153, filed Oct. 20, 2006, entitled "Extra Fast Serial Gigabit Media Independent Interface (XFSGMII)," incorporated by reference herein.

FIELD OF THE INVENTION

The present invention relates to communications among computer devices, and more particularly, to methods and apparatus for interfacing a plurality of encoded serial data streams with a serializer/deserializer circuit

BACKGROUND OF THE INVENTION

In a computer network, such as an Ethernet network, a computer device often utilizes a transceiver to transmit and receive signals with another computer device. An Ethernet transceiver, for example, typically includes a media access controller (MAC) that interfaces with applications running on the computer. In addition, such Ethernet transceivers typically also include a physical layer device, often referred to as a "PHY," that interfaces between the media access controller and a physical link media, such as a copper or fiber link. Generally, in a receive mode, physical layer devices receive data from the medium and decode the data into a form appropriate for the receiving device. Similarly, in a transmit mode, physical layer devices obtain data from the transmitting device, typically from the media access controller, and convert the data into a media-appropriate form.

As semiconductor technologies go to finer geometries, a greater amount of integration occurs in the Ethernet switch and the PHY technology. Octal Gigabit Ethernet PHYs and single chip 48-port switches, for example, are currently the leading edge of this development. A large number of pins are currently required on an Ethernet switch to interface with the physical layer device. A Serial Gigabit Media Independent Interface (SGMII) format is often used to interface between multi-port physical layer devices and Ethernet switches in order to transmit Ethernet data frames between devices. SGMII is a serialization of the GMII interface defined in the IEEE 802.3-2002 standard SGMII specifies the transmission of Ethernet data flames using well-known 8B/10B encoding techniques. Control information can be transmitted in an out-of-band control channel between the devices. Current implementations of the SGMII format require over 300 pins and up to 7.2 Watts of system power for the interface between a 48-port the Ethernet switch and the physical layer devices In addition, a significant amount of die area is required for the I/O circuits and buffers and printed circuit board area is also required to route these signals. These signals often have to be touted over back planes adding further expense.

A need therefore exists for an SGMII interface that reduces the pin count and system power

SUMMARY OF THE INVENTION

Generally, methods and apparatus are provided for interfacing a plurality of encoded serial data streams, such as Serial Gigabit Media Independent Interface streams, to a serializer/deserializer circuit. According to one aspect of the invention, a method is provided for transmitting a plurality of encoded serial data streams. The method comprises the steps of receiving the plurality of encoded serial data streams, wherein the plurality of encoded serial data streams have been encoded using an encoding scheme that provides a substantially uniform distribution of a first code and a second code; marking at least one of the encoded serial data streams; and combining at least two of the plurality of encoded serial data streams into a single data stream. The single data stream can optionally be scrambled The marking may comprise the step of changing a first code to a predefined code. The encoding scheme can be, for example, an 8b/10b encoding scheme and the first code and the second code can be different binary values According to another aspect of the invention, a method is provided for receiving a plurality of encoded serial data streams. The method comprises the steps of receiving a single data stream comprised of the plurality of encoded serial data streams; detecting a mark in the single data stream; demultiplexing the single data stream into the plurality of encoded serial data streams based on the mark; and providing the demultiplexed plurality of encoded serial data streams to a decoder that decodes the plurality of encoded serial data streams using a decoding scheme that provides a substantially uniform distribution of a first code and a second code. The mark comprises a predefined code. The single data stream can optionally be descrambled.

A more complete understanding of the present invention, as well as further features and advantages of the present invention, will be obtained by reference to the following detailed description and drawings.

DETAILED DESCRIPTION

Figure 1:
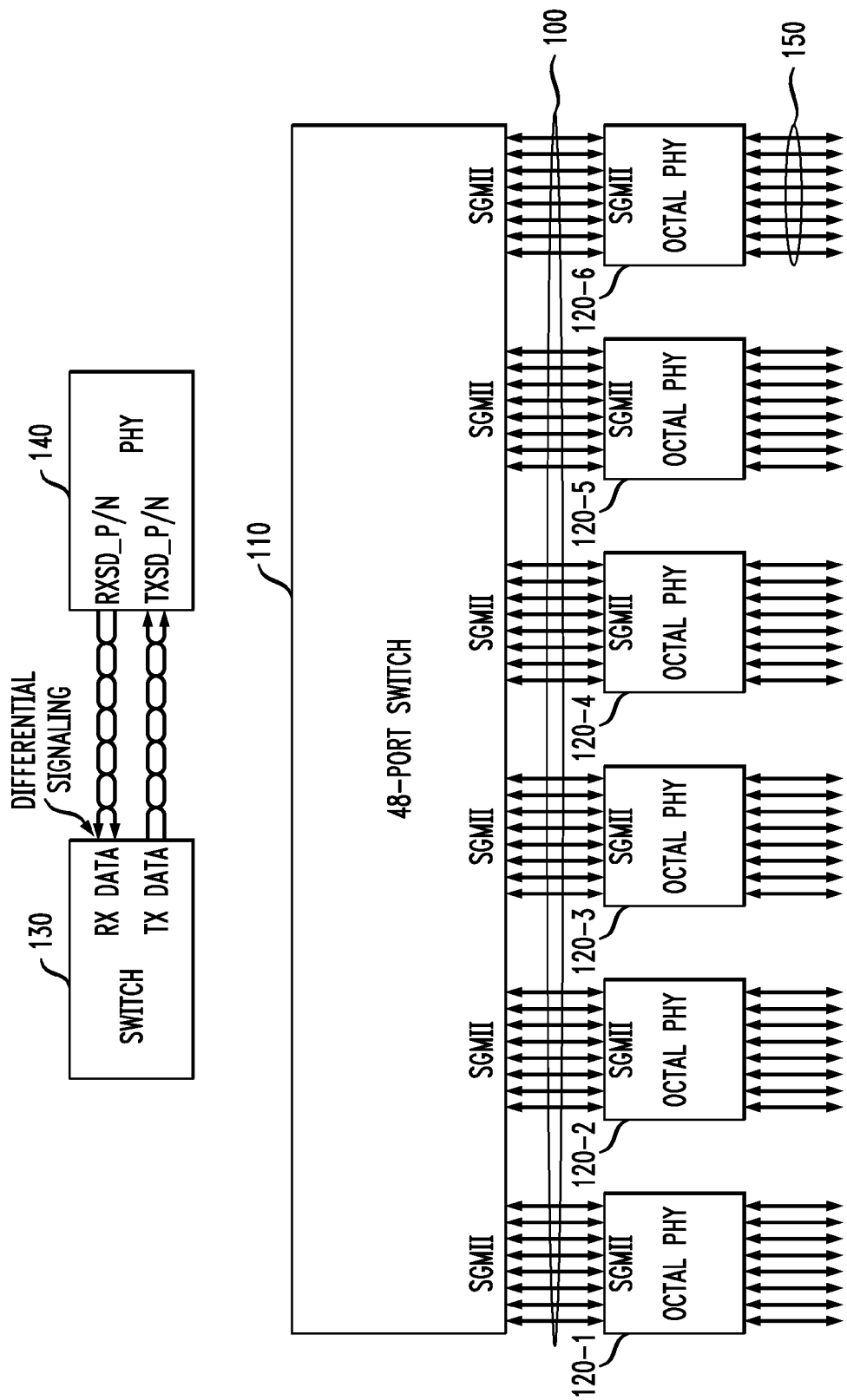
FIG. 1 is a block diagram of a conventional interface between an Ethernet switch and one or more physical layer devices (PHYs)

FIG. 1 is a block diagram of a conventional interface 100 between an Ethernet switch 110 and one or more physical layer devices (PHYs) 120-1 through 120-6. As shown in FIG. 1, the exemplary Ethernet switch 110 has 48 ports, and each port, such as the exemplary port 130 shown in further detail, comprises a 4-pin SGMII Interface (two transmit pins and two receive pins). Each exemplary PHY device 120 has 8 ports, and each port such as the exemplary port 140 shown in further detail, also has a 4-pin SGMII Interface. Each exemplary PHY device 120 has 8 media independent interface (MDI) ports 150 for connection to the 8 copper cables via an RJ-45 connector.

As previously indicated, SGMII is an industry standard Switch PHY serial interface. Among other benefits, the SGMII standard is said to exhibit a low pin count (4 pins) and is easy to route the signals, allowing smaller package sizes. The SGMII specification is defined, for example, in Cisco, "Serial GMII Specification," Engineering Document-46158, incorporated by reference herein See also, IEEE Standards for 1000Base-X, clauses 36 and 37, described in IEEE 802.3-2002, incorporated by reference herein.

As indicated above, current implementations of the SGMII format require over 300 pins and up to 7.2 Watts of system power for the interface between the Ethernet switch 110 and the physical layer devices 120. In addition, a significant amount of die area, on the order of 14 square millimeters, is also required for the I/O circuits and buffers. The present invention provides an improved SGMII interface, referred to herein as an Extra Fast Serial Gigabit Media Independent Interface (XFSGMII), with reduced pin count and system power.

Figure 2:
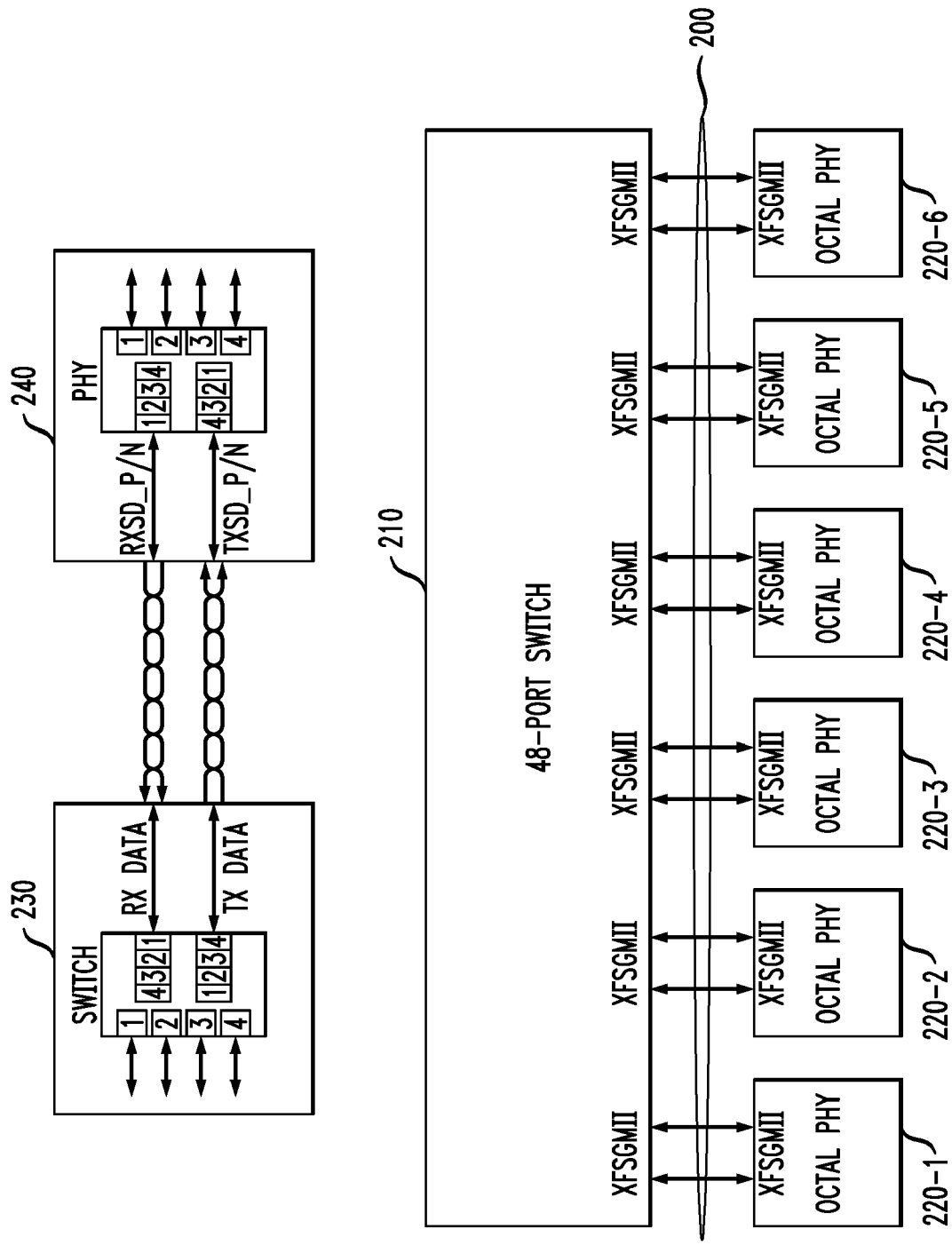
FIG. 2 is a block diagram of an interface between an Ethernet switch and one or more physical layer devices (PHYs), in accordance with the present invention.

FIG. 2 is a block diagram of an interface 200 between an Ethernet switch 210 and one or more physical layer devices (PHY) 220-1 through 220-6, in accordance with the present invention According to one aspect of the invention, the interface 200 multiplexes four ports over one serial link. In this manner, the disclosed interface 200 can operate at a rate that is four times faster than the conventional interface 100 of FIG. 1. Thus, as shown in FIG. 2, the exemplary Ethernet switch 210 has 48 ports, which are multiplexed in groups of four to provide 12 aggregated ports, and each aggregated port, such as the exemplary aggregated port 230, shown in further detail, comprises a 4-pin XFSGMII Interface (two transmit pins and two receive pins). Each exemplary PHY device 220 has 8 ports, which are also multiplexed in groups of four to provide two aggregated ports, and each aggregated port, such as the exemplary aggregated port 240 shown in further detail, also has a 4-pin XFSGMII Interface. Each exemplary aggregated port is a serial link operating at 5 GHz.

Thus, the exemplary embodiment shown in FIG. 2 only requires eight pins for each Octal PHY 220, for a significant pin count savings The exemplary 48-port switch 210 is reduced from 298 pins (FIG. 1) to 82 pins (FIG. 2) (approximately 85 pins if power and ground are included). The area of the I/O circuits and buffers of 200 is likewise reduced to approximately 7 square millimeters The XFSGMII interface uses 3.6 Watts of system power for the interface between the Ethernet switch 210 and the physical layer devices 220.

As previously indicated, the present invention multiplexes foul serial Gigabit data stream of the Ethernet switch 210 onto a single serial link. According to one aspect of the invention, the disclosed XFSGMII interface marks at least one of the multiplexed serial Gigabit data streams prior to the multiplexing. For example, the XFSGMII inter face can mark the port 0 stream by changing a first code to a predefined code.

According to another aspect of the invention, the multiplexed data stream is scrambled to remove tones. The scrambling addresses potential changes to the spectral characteristics that may be caused by the exemplary 4:1 multiplexing. This ensures that there are no tones in the transmitted spectrum and aids the equalizer which is typically used for back plane applications.

Figure 3:
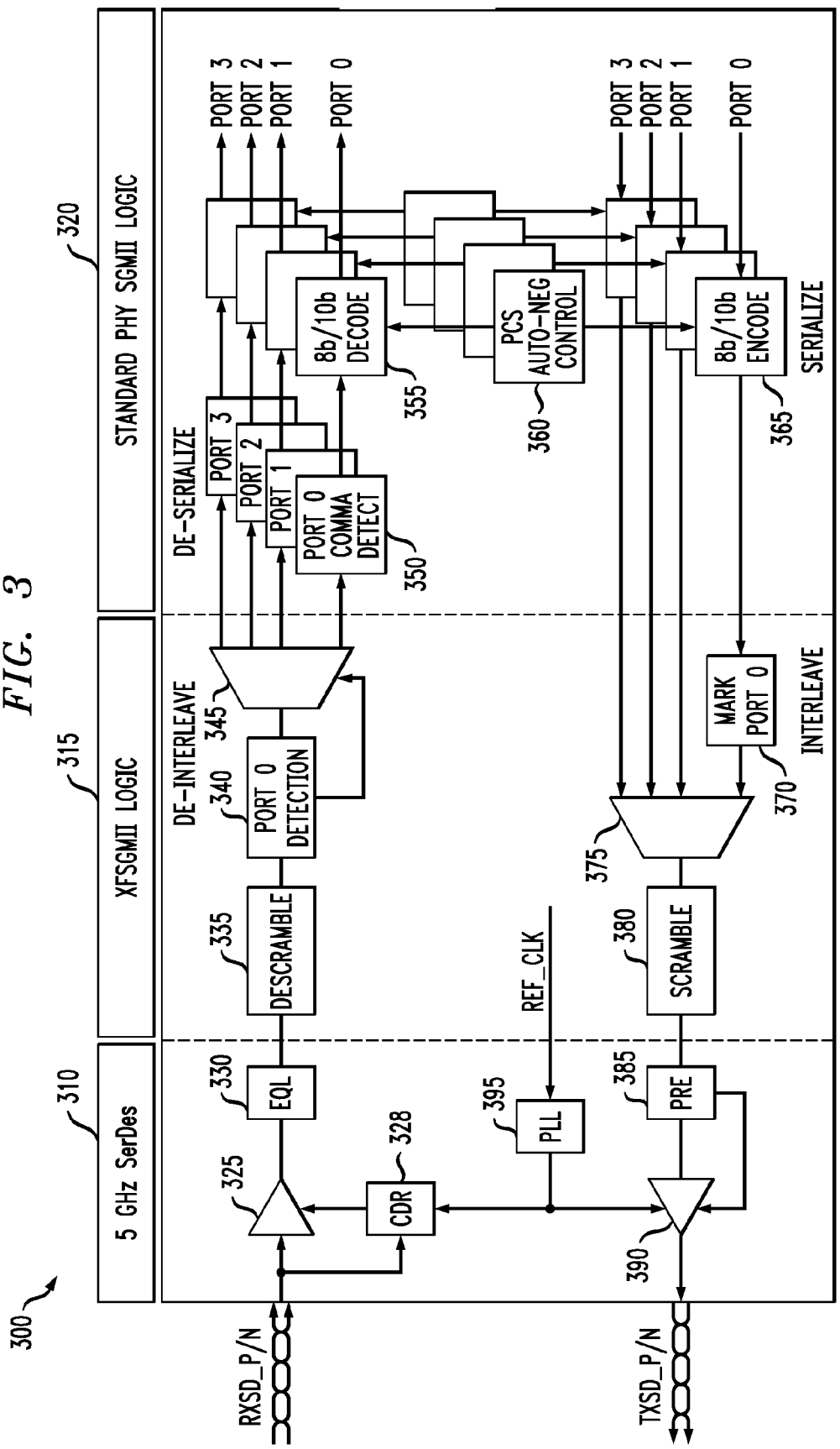
FIG. 3 is a block diagram of an exemplary XFSGMII interface incorporating features of the present invention.

FIG. 3 is a block diagram of an exemplary XFSGMII interface 300 incorporating features of the present invention. The exemplary interface 300 includes a serializer/deserializer 310, XFSGMII logic 315 and conventional SGMII logic 320. As shown in FIG. 3, a received signal is initially processed by a buffer 325 that clocks the received data according to a clock signal generated from the received data by a clock and data recovery system 328 that is based on a reference clock source from a phase locked loop 395. The received signal is then equalized by an equalizer 330, in a known manner.

The equalized signal is then descrambled by a descrambler 335 to perform the inverse scrambling operation that was employed by the transmitter (see below). The descrambled is then applied to a detection block 340 to search for the marking that was applied by the transmitter to identify, for example, port 0.

In order to allow the receiver circuitry to de-interleave the aggregated 5 GHz data stream into the original 1.25 GHz data streams it is necessary to insert synchronization (marking) information. This is preferably done without adding overhead or latency. The exemplary XFSGMII interface 300 substitutes a reserved comma code /K28.1/ for the standard comma code /K28.5/ just for port 0 (other reserved codes can be used to mark one of the streams). This allows the receiver circuit to detect the comma code /K28.1/ for port 0 at block 340 and thus determine the correct bit to use for demultiplexing the four ports. One advantage of using comma code /K28.1/ is that the requirements for sufficient bit transitions ale met and are equivalent to the standard serial transmission. The identified marking is then used by a demultiplexer 345 to demultiplex the serial data stream into the four separate Gigabit data streams.

The four separate Gigabit data streams are then serialized by the conventional SGMII logic 320, in a known manner. As shown in FIG. 3, each of the four separate Gigabit data streams are processed at stage 350 to detect the port 0 comma, prior to employing 8b/10b decoding at stage 355, to produce the decoded data In addition, port independent auto-negotiation is performed at stage 360. Generally, 8b/10b encoding is a line code that maps 8-bit symbols to 10-bit symbols, for example, to achieve DC-balance and bounded disparity, and provide a sufficient number of state changes to allow reasonable clock recovery. In other words, 8b/10b encoding typically ensures that there are just as many "1"s as "0"s in a string of two symbols and vice versa (i.e., a substantially uniform code distribution), and that there are not too many "1"s or "0"s in a row.

On the transmit side, the individual Gigabit data streams are applied to an 8b/10b encoder 365, in a known manner Port independent auto-negotiation is again performed at stage 360. The 8b/10b encoded data streams are then applied to the XFSGMII logic 315. As shown in FIG. 3, the serialized data stream is interleaved by the XFSGMII logic 315 following 8b/10b encoding 360.

As indicated above, the present invention marks at stage 370 at least one of the serial Gigabit data streams prior to the multiplexing. In one exemplary implementation, for one stream, such as port 0, among the four streams from ports 0-3 that are multiplexed together, the XFSGMII interface 315 substitutes a comma with a reserved comma /K28.1/ for port synchronization. See, for example, IEEE 802.3-2002, clause 36.2, incorporated by reference herein, for a description of the 8b/10b control codes.

The four streams, including the marked stream are multiplexed into an aggregated serial stream by a multiplexer 375. Thereafter, the multiplexed data stream is optionally scrambled by a self-synchronizing scrambler 380 to remove tones. The scrambling addresses potential changes to the spectral characteristics that may be caused by the exemplary 4:1 multiplexing at stage 375 This ensures that there are no tones in the transmitted spectrum and aids the equalizer which is typically used for back plane applications. The scrambled data is optionally processed at stage 385 using well-known pre-emphasis techniques. The equalized signal is then clocked out using a buffer 390, timed by the clock signal generated by the phase locked loop 395.

It is noted that each Gigabit port 0-3 in FIG. 3 is independent and can be operating at any of 3 different exemplary speeds (10 Mb/s, 100 Mb/s or 1000 Mb/s), could be in an idle state (no Gigabit link) or could be in the middle of auto-negotiation of link speed. The auto-negotiation information, error codes and control codes should be transmitted transparently to the XFSGMII interface. The XFSGMII logic 315 should be inserted in between the standard SGMII logic 320 and 5 GHz SerDes circuitry 310, as shown in FIG. 3, without modification of these circuits.

As discussed above, the exemplary XFSGMII logic 315 interleaves the 1.25 GHz data streams of each of 4-ports 0-3 after the 8b/10b encoding 365 into a single 5 GHz data stream. This preserves the auto-negotiation information, error codes and control codes and ensures that the ports can operate independently.

It is noted that the disclosed techniques can be applied to multiplex any number of SGMII 1.25 GHz data streams onto a higher bit rate serial stream, as would be apparent to a person of ordinary skill in the art (for even greater saving in pins and power at the expense of greater complexity in the SerDes function).

Figures 4, 5:
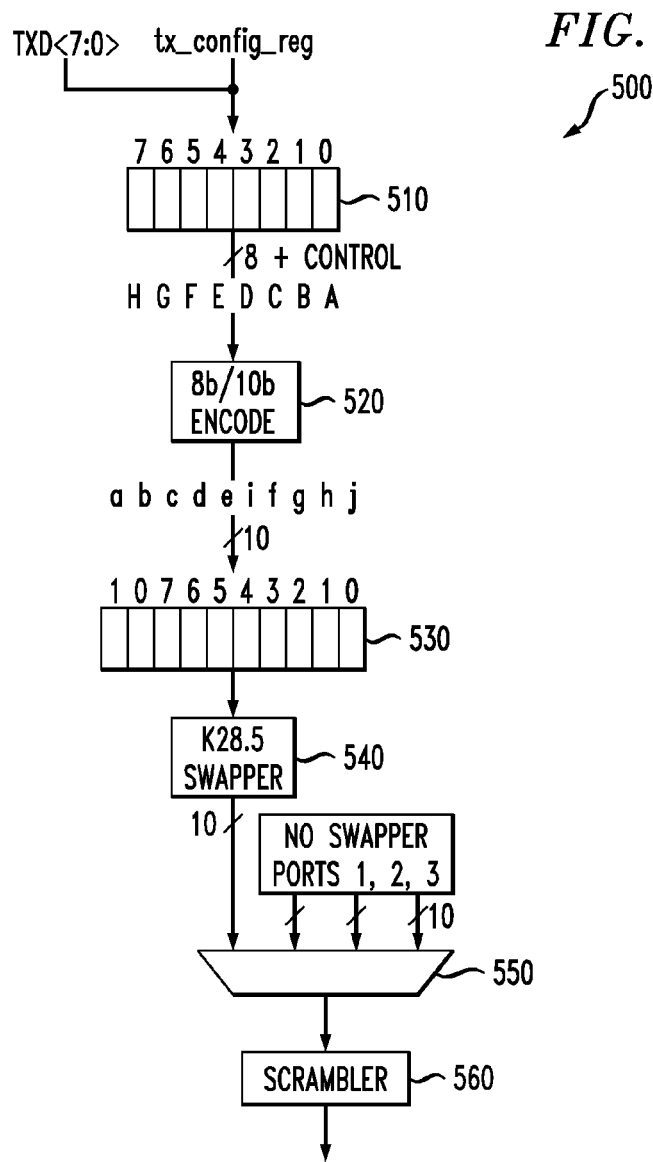
FIG. 4 is a table illustrating exemplary multiples of data streams that can be multiplexed for practical applications in accordance with the present invention.
FIG. 5 illustrates the marking process in accordance with the present invention in further detail.

FIG. 4 is a table 400 illustrating exemplary multiples of data streams that can be multiplexed for practical applications.

FIG. 5 illustrates the marking process 500 in accordance with the present invention in further detail. As shown in FIG. 5, the Gigabit data streams to be transmitted are buffered in an 8 bit buffer at stage 510, prior to 8b/10b encoding at stage 520. See, IEEE 802.3-2002 Standard, Part 3, Page 36, Section "36.2.4 8B/10B Transmission Code."

The encoded data streams to be transmitted are buffered at stage 530 in a 10 bit buffer. At least one of the encoded Gigabit data streams, such as the port 0 stream, is marked at stage 540, prior to the multiplexing, for example, by substituting a comma with a reserved comma /K28.1/ for port synchronization. Since the marking is performed after the 8b/10b encoding, there are no modifications required to the SGMII logic 320. The remaining encoded Gigabit data streams are not marked. The four exemplary encoded Gigabit data streams are multiplexed at stage 550, and then optionally scrambled at stage 560, in the manner described above.

Figure 6:
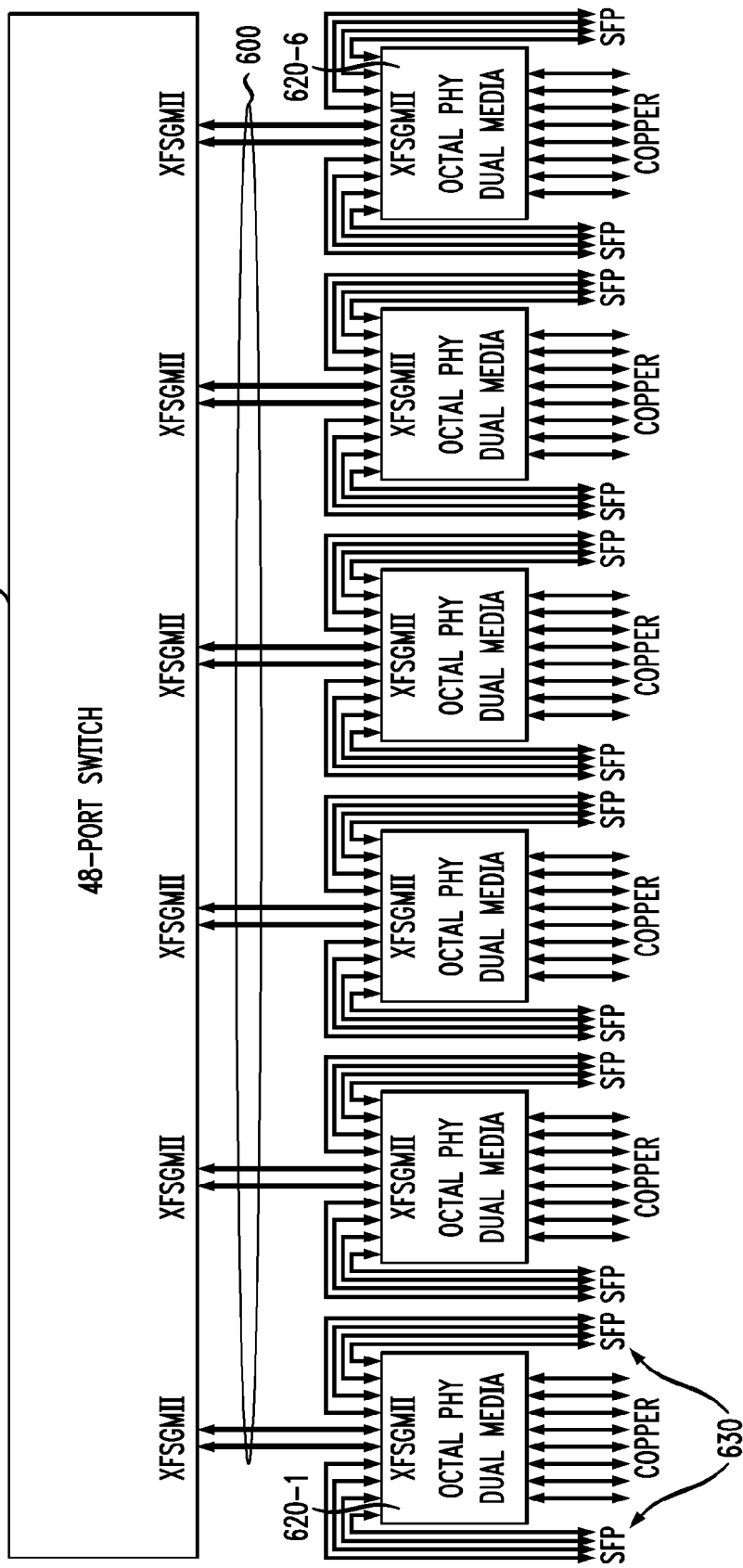
FIG. 6 is a block diagram of an interface between an Ethernet switch and one or more physical layer devices (PHYs), that supports dual media in accordance with another embodiment of the present invention.

FIG. 6 is a block diagram of an interface 600 between an Ethernet switch 610 and one or more physical layer devices (PHY) 620-1 through 620-6, that supports dual media (copper and fiber) in accordance with another embodiment of the present invention. The interface 600 multiplexes four ports over one serial link, in a similar manner to FIG. 2. Thus, as shown in FIG. 6, the exemplary Ethernet switch 610 has 48 ports, which are multiplexed in groups of four to provide 12 aggregated ports, and each aggregated port comprises a 4-pin XFSGMII Interface (two transmit pins and two receive pins).

Each exemplary PHY device 620-1 through 620-6 has 8 ports, which are also multiplexed in groups of four to provide two aggregated ports, and each aggregated port also has a 4-pin XFSGMII Interface. Each exemplary aggregated port is a serial link operating at 5 GHz In the embodiment shown in FIG. 6, each exemplary PHY device 620-1 through 620-6 has 8 MDI ports for connection to the copper media through RJ-45 connectors and 8 ports for small form factor pluggable (SFP) connectors 630 for interfacing with the fibers via optical transceiver modules. The PHY devices 620-1 through 620-6 optionally employ auto-detect on an arbitrary number of ports for detecting whether a signal is present on the copper or fiber media.

The disclosed embodiments, relative to the implementation of FIG. 1, (i) reduce the pin count by a factor of 4, (ii) reduce the system power by a factor of 2, (iii) maintain independent port auto-negotiation and flow of error codes and control codes, and (iv) preserve the spectral characteristics of the transmitted signal through scrambling to improve back plane performance. Exemplary embodiments support data rates from 1 to 10 Gb/s A plurality of identical die are typically formed in a repeated pattern on a surface of a wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer; the machine becomes an apparatus for practicing the invention. When implemented on a general-purpose processor; the program code segments combine with the processor, to provide a device that operates analogously to specific logic circuits It is to be understood that the embodiments and variations shown and described herein are merely illustrative of the principles of this invention and that various modifications may be implemented by those skilled in the art without departing from the scope and spirit of the invention.

We claim:

1. A method for interfacing a plurality of encoded serial data streams to a serializer/deserializer circuit, comprising:
   receiving said plurality of encoded serial data streams, wherein said plurality of encoded serial data streams have been encoded using an encoding scheme that provides a substantially uniform distribution of a first code and a second code;
   marking at least one of said encoded serial data streams by substituting a first codeword in said at least one of said encoded serial data streams with a different codeword; and
   combining at least two of said plurality of encoded serial data streams into a single data stream.

2. The method of claim 1, wherein said combining step comprises the step of multiplexing said at least two of said plurality of encoded serial data streams into a single data stream.

3. The method of claim 1, wherein said plurality of encoded serial data streams are Gigabit Media Independent Interface streams.

4. The method of claim 1, wherein said plurality of encoded serial data streams are Serial Gigabit Media Independent Interface streams.

5. The method of claim 1, further comprising the step of scrambling said single data stream.

6. The method of claim 1, wherein said encoding scheme is an 8 b/10 b encoding scheme and wherein said first code and said second code are different binary values.

7. A method for interfacing a serializer/deserializer circuit to an interface that generates a plurality of encoded serial data streams, comprising:

receiving a single data stream comprised of said plurality of encoded serial data streams;

detecting a mark in said single data stream, wherein said mark comprises a predefined codeword substituted in said at least one of said encoded serial data streams for a first codeword in said at least one of said encoded serial data streams;

demultiplexing said single data stream into said plurality of encoded serial data streams based on said mark; and providing said demultiplexed plurality of encoded serial data streams to a decoder that decodes said plurality of encoded serial data streams using a decoding scheme that provides a substantially uniform distribution of a first code and a second code.

8. The method of claim 7, wherein said interface that generates a plurality of is encoded serial data streams is a Gigabit Media Independent Interface.

9. The method of claim 7, wherein said interface that generates a plurality of encoded serial data streams is a Serial Gigabit Media Independent Interface.

10. The method of claim 7, further comprising the step of descrambling said single data stream.

11. The method of claim 7, wherein said decoding scheme is an 8b/10b decoding scheme and wherein said first code and said second code are different binary values.

12. An interface for interfacing a plurality of encoded serial data streams to a serializer/deserializer circuit, comprising:

one or more input ports for receiving said plurality of encoded serial data streams, wherein said plurality of encoded serial data streams have been encoded using an encoding scheme that provides a substantially uniform distribution of a first code and a second code;

a marking circuit that marks at least one of said encoded serial data streams by substituting a first codeword in said at least one of said encoded serial data streams with a different codeword; and a multiplexer that combines at least two of said plurality of encoded serial data streams into a single data stream.

13. The interface of claim 12, wherein said plurality of encoded serial data streams are one or more of Gigabit Media Independent Interface streams and Serial Gigabit Media Independent Interface streams.

14. The interface of claim 12, further comprising a scrambler that scrambles said single data stream.

15. The interface of claim 12, wherein said encoding scheme is an 8b/10b encoding scheme and wherein said first code and said second code are different binary values.

16. An interface for interfacing a serializer/deserializer circuit to an interface that generates a plurality of encoded serial data streams, comprising:

one or more input ports for receiving a single data stream comprised of said plurality of encoded serial data streams;

a mark detecting circuit for detecting a mark in said single data stream, wherein said mark comprises a predefined codeword substituted in said at least one of said encoded serial data streams for a first codeword in said at least one of said encoded serial data streams;

a demultiplexer for demultiplexing said single data stream into said plurality of encoded serial data streams based on said mark; and one or more output ports for providing said demultiplexed plurality of encoded serial data streams to a decoder that decodes said plurality of encoded serial data streams using a decoding scheme that provides a substantially uniform distribution of a first code and a second code.

17. The interface of claim 16, further comprising a descrambler for descrambling said single data stream.

18. The interface of claim 16, wherein said plurality of encoded serial data streams are one or more of Gigabit Media Independent Interface streams and Serial Gigabit Media Independent Interface streams.

19. The interface of claim 16, wherein said decoding scheme is an 8b/10b decoding scheme and wherein said first code and said second code are different binary values.

* * * * *